US009112471B1

United States Patent
Jain et al.

(10) Patent No.: US 9,112,471 B1
(45) Date of Patent: Aug. 18, 2015

(54) GAIN CONTROL SYSTEM FOR WIRELESS COMMUNICATION SYSTEM

(71) Applicants: Nitin Jain, New Delhi (IN); Gopikrishna Charipadi, Bangalore (IN)

(72) Inventors: Nitin Jain, New Delhi (IN); Gopikrishna Charipadi, Bangalore (IN)

(73) Assignee: Freescale Semiconductor, Inc., Austin, TX (US)

( * ) Notice: Subject to any disclaimer, the term of this patent is extended or adjusted under 35 U.S.C. 154(b) by 52 days.

(21) Appl. No.: 14/218,996

(22) Filed: Mar. 19, 2014

(51) Int. Cl.
*H04L 27/08* (2006.01)
*H03G 3/30* (2006.01)

(52) U.S. Cl.
CPC ................... *H03G 3/3036* (2013.01)

(58) Field of Classification Search
CPC ............. H04W 52/52; H04W 72/0446; H04B 17/318; H03G 3/32; H04L 27/3809
See application file for complete search history.

(56) References Cited

U.S. PATENT DOCUMENTS

| 8,478,213 | B2 | 7/2013 | Muhammad | |
|---|---|---|---|---|
| 8,494,467 | B2 * | 7/2013 | Henttonen et al. | 455/136 |
| 8,773,966 | B1 * | 7/2014 | Petrovic et al. | 370/203 |
| 8,830,859 | B2 * | 9/2014 | Weng et al. | 370/252 |
| 2005/0254442 | A1 * | 11/2005 | Proctor et al. | 370/294 |
| 2009/0207954 | A1 * | 8/2009 | Dai et al. | 375/345 |
| 2010/0046679 | A1 * | 2/2010 | Kajakine et al. | 375/345 |
| 2012/0176922 | A1 | 7/2012 | Ehasan | |
| 2012/0236832 | A1 | 9/2012 | Ogawa | |
| 2013/0003584 | A1 | 1/2013 | Alriksson | |
| 2013/0315093 | A1 * | 11/2013 | Jiang | 370/252 |
| 2013/0342276 | A1 * | 12/2013 | Ito | 330/278 |

* cited by examiner

*Primary Examiner* — Shuwang Liu
*Assistant Examiner* — Sung Ahn
(74) *Attorney, Agent, or Firm* — Charles Bergere

(57) ABSTRACT

A gain control system for a gain stage of a wireless communication system includes a gain control module and a mode selection module. The gain control module is operable in automatic gain control (AGC) and manual gain control (MGC) modes. The mode selection module checks the presence of first user-data in the first sub-frame based on a received signal strength indication (RSSI) value and/or a decibel amplitude level relative to full scale (dBFS) value, the presence of second user-data in a second sub-frame subsequent to the first sub-frame based on an advance information, calculates an estimated signal power level, and configures the gain control module in one of the AGC and MGC modes. Based on the mode, the gain control module provides a gain value to the gain stage.

19 Claims, 4 Drawing Sheets

GAIN CONTROL SYSTEM FOR WIRELESS COMMUNICATION SYSTEM

BACKGROUND OF THE INVENTION

The present invention relates generally to wireless communication networks, and, more particularly, to a gain control system for a wireless communication system.

A wireless communication network includes a multiple wireless communication systems, such as base stations and user equipment devices (UEs). The base stations and UEs communicate using radio-frequency (RF) signals, which conform to specific standards and technologies including long term evolution (LTE), high speed packet access (HSPA) and third generation partnership project (3GPP) standards. RF signals used in LTE based wireless communication have multiple sub-frames. These sub-frames carry user-data used to transfer information between the base stations and UEs. The sub-frames can be of two types, user sub-frames and silent sub-frames. Sub-frames that include user-data are referred to as user sub-frames and sub-frames that do not include user-data, but may have interference from other RF signals, are referred to as silent sub-frames. User sub-frames are further categorized into user sub-frames with low user-data and user sub-frames with high user-data. User sub-frames that carry voice over Internet protocol (VoIP) data and require low resource allocation for transmission are referred to as user sub-frames with low user-data. Such user sub-frames are characterized by a low number of resource blocks (RBs). On the other hand, user sub-frames that carry full-data traffic and require high resource allocation for transmission are referred to as user sub-frames with high user-data. Such user sub-frames are characterized by a high number of RBs.

A typical wireless communication system (both a base station and a UE) includes an RF front-end, a gain controller, a gain stage, an analog-to-digital converter (ADC), and a processor, which may be referred to as to baseband processor. The processor executes a wireless protocol stack. The RF front-end includes an antenna that receives the RF signal and signal-conditioning circuits such as filters that perform conditioning operations on the received RF signal. The gain stage amplifies the RF signal. The ADC converts the amplified RF signal from the analog domain to digital baseband samples in the digital domain. One of the layers, typically the physical layer of the wireless protocol stack that runs on the baseband processor, receives and decodes the user-data of the user sub-frames of the digital baseband samples.

The gain stage includes an amplifier that amplifies a portion of the RF signal associated with a sub-frame based on a gain value provided by the gain controller. The gain controller includes a gain register that stores the gain value. The gain controller is configured to operate in two modes, automatic gain control (AGC) and manual gain control (MGC). In AGC mode, the gain controller computes and stores the gain value associated with a received sub-frame and uses the stored gain value for a subsequent sub-frame. In the MGC mode, the gain controller uses a gain value generated by the processor for the subsequent sub-frame. The amplified RF signal received by the ADC must be within a predetermined operating range that is specific to the ADC and refers to power levels of the RF signal at which the ADC functions optimally. To reach the predetermined operating range, the average RF signal power needs to be amplified by the gain stage to a pre-configured set-point. For example, if the ADC set-point is −5 dBm, an RF signal having an average power of −33 dBm must be amplified by the gain stage with a gain value of 28 dB to enable optimum conversion by the ADC. The ADC further has a saturation point associated with it. Typically, the value of the saturation point is 7 dBm. Thus, if the average power of the amplified RF signal crosses 7 dBm, the ADC may not be able to optimally convert and the wireless protocol stack may not be able to decode the digital baseband samples.

On certain occasions, the wireless communication system may receive one or more silent sub-frames between multiple user sub-frames, a scenario that is referred to as a burst traffic scenario. When the gain controller is configured to operate in AGC mode and silent sub-frames or user sub-frames with low user-data are received, the gain controller computes a first gain value to amplify a portion of the RF signal associated with the silent sub-frames or the user sub-frames with low user-data, to the operating range of the ADC. The first gain value is stored in the gain register and corresponds to the silent sub-frame or the user sub-frame with low user-data. Since a very low power is associated with the silent sub-frames or user sub-frames with low user-data, the first gain value is very high. For example, the portion of the RF signal associated with a silent sub-frame in LTE may have an average power of −33 dBm either due to interference in the RF environment. In another example, the portion of the RF signal associated with a user sub-frame with low user-data may have an average power of −33 dBm because it carries a low amount of data. Thus, the first gain value generated by the gain controller would be 28 dB. When a user sub-frame having high user-data is received subsequently, the gain controller provides the first gain value to the gain stage. If the portion of the RF signal associated with the user sub-frame having high user-data has an average power of −19 dBm, the RF signal is amplified to a power of 9 dBm, which is beyond the saturation point of the ADC. Therefore, the wireless protocol stack may not be able to decode this user-sub-frame. However, since the gain controller is operating in AGC mode, the gain controller adjusts the gain value of the next user sub-frames, thereby facilitating the decoding of the subsequent user sub-frames. Thus, decoding fails for the first user sub-frame having high user-data that follows the silent sub-frame or the user sub-frame with low user-data in the burst traffic scenario, which adversely affects the decoding performance of the wireless communication system.

One known technique to overcome this problem is to change the configuration of the RF front-end by tuning components of the RF front-end during the design stage. The gain controller has many parameters that allow control over the gain value provided for sub-frames. These parameters can be programmed or tuned to provide an optimum gain value. However, this technique does not improve the decoding performance of the wireless communication system in various traffic scenarios, such as burst traffic scenarios. Further, this technique requires multiple iterations to arrive at the optimum gain value and therefore increases the wireless communication system design time.

Therefore it would be advantageous to have a system for providing gain control in a wireless communication system that prevents an ADC of the wireless communication system from reaching saturation, and avoids decoding failures associated with user sub-frames.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE INVENTION

Figure 1:
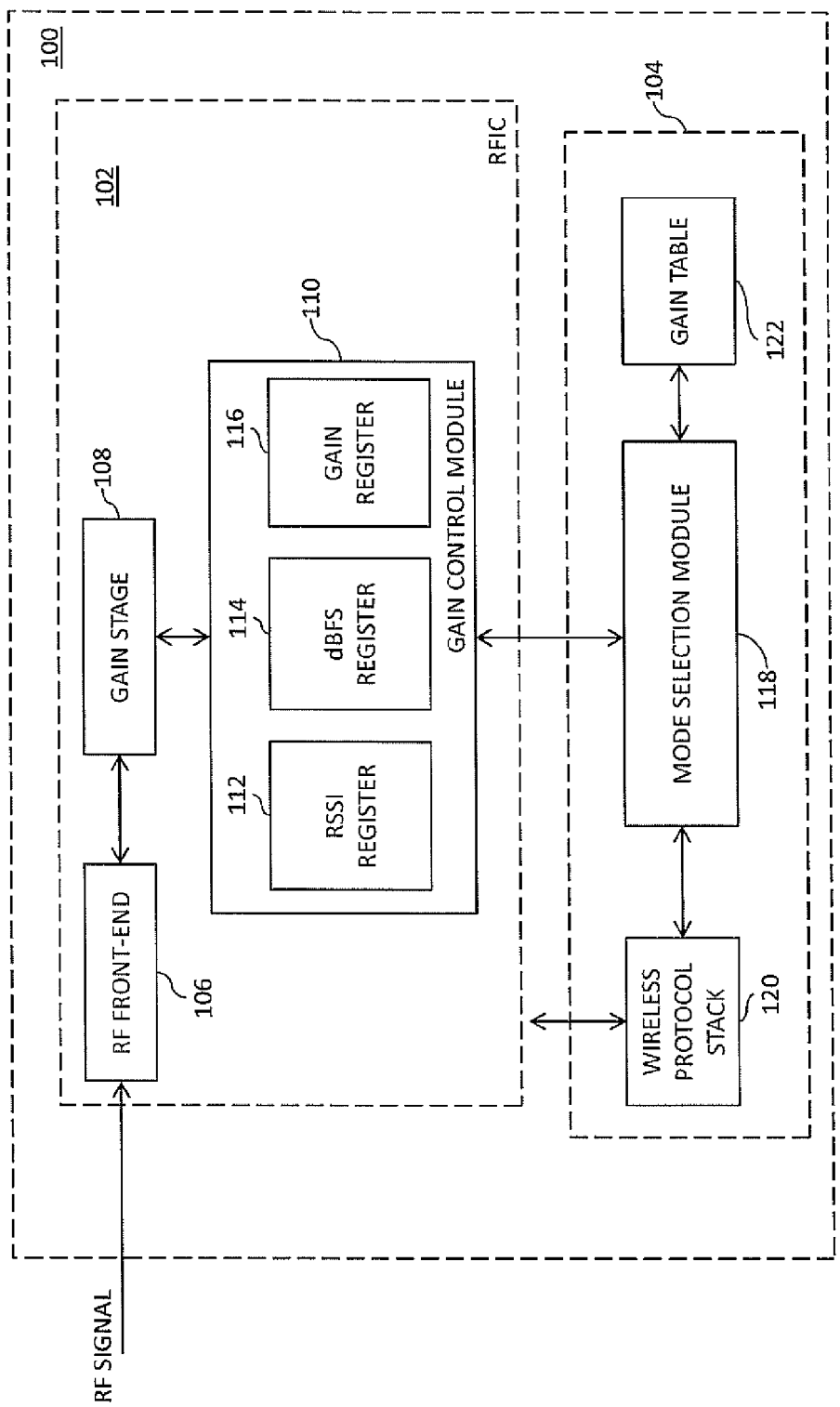
FIG. 1 is a schematic block diagram of a wireless communication system in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a system for providing gain control to a gain stage of a wireless communication system is provided. The gain stage of the wireless communication system receives a radio frequency (RF) signal. The RF signal includes a plurality of sub-frames. The system includes a gain control module and a mode selection module. The gain control module determines a received signal strength indication (RSSI) value and a decibel amplitude level relative to full scale (dBFS) value of a first sub-frame of the plurality of sub-frames. The gain control module stores a first gain value for a second sub-frame of the plurality of sub-frames that is received subsequent to the first sub-frame when configured to operate in an automatic gain control (AGC) mode and a second gain value for the second sub-frame when configured to operate in a manual gain control (MGC) mode. The mode selection module is connected to the gain control module. The mode selection module receives the RSSI and dBFS values, checks the presence of first user-data in the first sub-frame based on at least one of the RSSI and dBFS values and configures the gain control module to operate in the AGC mode when the first sub-frame includes the first user-data. The mode selection module checks the presence of second user-data in the second sub-frame based on an advance intelligence information associated with the RF signal when the first sub-frame does not include the first user-data and configures the gain control module to operate in the AGC mode when the second sub-frame does not include the second user-data. The mode selection module calculates an estimated signal power level for a portion of the RF signal corresponding to the second sub-frame based on the advance intelligence information and the first gain value when the second sub-frame includes the second user-data and configures the gain control module to operate in the AGC mode when the estimated signal power level is less than a threshold power level and the MGC mode when the estimated signal power level exceeds the threshold power level. The gain stage amplifies the portion of the RF signal corresponding to the second sub-frame based on the first gain value when the gain control module operates in the AGC mode and the second gain value when the gain control module operates in the MGC mode.

In another embodiment of the present invention, a wireless communication system is provided. The wireless communication system includes a RF front-end, a gain controller, a gain stage, and a processor. The RF front-end receives a RF signal that includes a plurality of sub-frames. The gain controller determines a received signal strength indication (RSSI) value and a decibel amplitude level relative to full scale (dBFS) value of a first sub-frame of the plurality of sub-frames, and stores a first gain value for a second sub-frame of the plurality of sub-frames that is received subsequent to the first sub-frame when configured to operate in an automatic gain control (AGC) mode and a second gain value for the second sub-frame when configured to operate in a manual gain control (MGC) mode. The gain stage connected to the gain controller and the RF front-end amplifies a portion of the RF signal corresponding to the second sub-frame based on the first gain value when the gain controller operates in the AGC mode and the second gain value when the gain controller operates in the MGC mode. The processor is connected to the gain controller. The processor receives the RSSI and dBFS values, checks the presence of first user-data in the first sub-frame based on at least one of the RSSI and dBFS values and configures the gain controller to operate in the AGC mode when the first sub-frame includes the first user-data. The processor checks the presence of second user-data in the second sub-frame based on advance intelligence information associated with the RF signal when the first sub-frame does not include the first user-data and configures the gain controller to operate in the AGC mode when the second sub-frame does not include the second user-data. The processor calculates an estimated signal power level for the portion of the RF signal corresponding to the second sub-frame based on the advance intelligence information and the first gain value when the second sub-frame includes the second user-data and configures the gain controller to operate in the AGC mode when the estimated signal power level is less than a threshold power level and the MGC mode when the estimated signal power level exceeds the threshold power level.

In yet another embodiment of the present invention, a method for controlling gain of a RF signal in a wireless communication system is provided. The wireless communication system includes a gain controller, a gain stage, and a processor. The RF signal includes a plurality of sub-frames. The gain controller determines a received signal strength indication (RSSI) value and a decibel amplitude level relative to full scale (dBFS) value of a first sub-frame of the plurality of sub-frames and generates a first gain value for a second sub-frame of the plurality of sub-frames. The processor checks the presence of first user-data in the first sub-frame based on at least one of the RSSI and dBFS values. The gain stage amplifies a portion of the RF signal that corresponds to the second sub-frame based on the first gain value when the first sub-frame includes the first user-data. The processor checks the presence of second user-data in the second sub-frame based on advance intelligence information associated with the RF signal when the first sub-frame does not include the first user-data. The gain stage then amplifies the portion of the RF signal that corresponds to the second sub-frame based on the first gain value when the first and second sub-frames do not include the first and second user-data, respectively. The processor further calculates an estimated signal power level for the portion of the RF signal corresponding to the second sub-frame based on the advance intelligence information and the first gain value when the first sub-frame does not include the first user-data and the second sub-frame includes the second user-data. The gain stage amplifies the portion of the RF signal that corresponds to the second sub-frame based on the first gain value when the estimated signal power level is less than a threshold power level. The processor further generates a second gain value for the second sub-frame when the estimated signal power level exceeds the threshold power level. The gain stage then amplifies the portion of the RF signal that corresponds to the second sub-frame based on the second gain value when the estimated signal power level exceeds the threshold power level.

Various embodiments of the present invention provide a system for providing gain control to a gain stage of a wireless communication system. The gain stage receives a RF signal that includes a plurality of sub-frames. The system includes a gain control module and a mode selection module. The gain control module determines a received signal strength indication (RSSI) value and a decibel amplitude level relative to full scale (dBFS) value of a first sub-frame of the plurality of sub-frames. The gain control module stores a first gain value for a second sub-frame of the plurality of sub-frames that is received subsequent to the first sub-frame when configured to operate in an automatic gain control (AGC) mode and a second gain value for the second sub-frame when configured to operate in a manual gain control (MGC) mode. The mode selection module is connected to the gain control module and receives the RSSI and dBFS values, checks the presence of first user-data in the first sub-frame based on at least one of the RSSI and dBFS values and configures the gain control module to operate in the AGC mode when the first sub-frame includes the first user-data, i.e. a user sub-frame.

If the first sub-frame does not include the first user-data, i.e. the first sub-frame is a silent sub-frame, the mode selection module checks the presence of second user-data in the second sub-frame based on advance intelligence information associated with the RF signal and configures the gain control module to operate in the AGC mode when the second sub-frame is a silent sub-frame. If the second sub-frame is a user sub-frame, the mode selection module calculates an estimated signal power level for a portion of the RF signal corresponding to the second sub-frame based on the advance intelligence information and the first gain value. The mode selection module then configures the gain control module to operate in the AGC mode when the estimated signal power level is less than a threshold power level, i.e. the pre-configured set-point of the analog-to-digital converter (ADC) and the MGC mode when the estimated signal power level exceeds the threshold power level. Thus, during a burst traffic scenario when the silent sub-frame is followed by the user sub-frame and the estimated signal power level exceeds the pre-configured set-point of the ADC, the mode selection module generates the second gain value and configures the gain control module to operate in the MGC mode. The second gain value is lower than the first gain value associated with the silent sub-frame. When the gain control module operates in the MGC mode, the gain stage amplifies the portion of the RF signal corresponding to the second sub-frame based on the second gain value (which is lower than the first gain value) and prevents the ADC from getting saturated. Since the ADC does not saturate, the user sub-frame subsequent to the silent sub-frame can be successfully decoded by the wireless communication system.

Referring now to FIG. 1, a schematic block diagram of a wireless communication system 100 in accordance with an embodiment of the present invention is shown. The wireless communication system 100 includes a radio frequency integrated circuit (RFIC) 102 and a processor 104. In an embodiment of the present invention, the processor 104 is a baseband processor.

The RFIC 102 includes an RF front-end 106, a gain stage 108 and a gain control module 110. In an embodiment of the present invention, the gain control module 110 is implemented in the baseband processor. The RF front-end 106 includes an antenna (not shown) that receives an RF signal and signal-conditioning circuits (not shown) such as filters that perform conditioning operations on the received RF signal. The received RF signal includes multiple sub-frames. The gain control module 110 is configured to operate in automatic gain control (AGC) and manual gain control (MGC) modes and includes a received signal strength indication (RSSI) register 112, a decibel amplitude level relative to full scale (dBFS) register 114 and a gain register 116. The gain control module 110 calculates a plurality of RSSI and dBFS values of data samples of a first sub-frame, computes an average of the RSSI and dBFS values, and provides the averaged RSSI and dBFS values as the RSSI and dBFS value associated with the first sub-frame. The gain control module 110 stores the RSSI and dBFS values of the first sub-frame in the RSSI and dBFS registers 112 and 114, respectively. The gain register 116 stores gain values of a second sub-frame of the plurality of sub-frames that is received subsequent to the first sub-frame. The gain control module 110 generates and stores a first gain value in the gain register 116 when configured to operate in the AGC mode. The gain control module 110 further stores a second gain value received from the processor 104 in the gain register 116 for the second sub-frame when configured to operate in the MGC mode. The first gain value is a gain value used by the gain stage 108 to amplify a sub-frame when the gain control module 110 operates in the AGC mode and the second gain value is a gain value used by the gain stage 108 to amplify a sub-frame when the gain control module 110 operates in the MGC mode. The gain stage 108 is connected to the gain control module 110 and the RF front-end 106 for receiving at least one of the first and second gain values from the gain control module 110. The gain stage 108 amplifies a portion of the RF signal corresponding to the second sub-frame based on the first gain value when the gain control module 110 operates in the AGC mode and the second gain value when the gain control module 110 operates in the MGC mode. The RFIC 102 further includes an analog-to-digital converter (ADC, not shown) that is connected to the gain stage 108 for receiving the amplified RF signal and converting the amplified RF signal to digital baseband samples. In an example, the ADC has a pre-configured set-point of −5 dBm and a saturation point of 7 dBm.

The processor 104 includes a mode selection module 118, a wireless protocol stack 120 and a gain table 122. The mode selection module 118 is connected to the gain control module 110 for receiving the RSSI and dBFS values of the first sub-frame from the RSSI and dBFS registers 112 and 114 and controlling the mode of operation (AGC and MGC) of the gain control module 110. The processor 104 is connected to the ADC. The wireless protocol stack 120, which runs on the processor 104, receives the user-data of the user sub-frames of the digital baseband samples from the ADC and decodes the user-data of the user sub-frames of the digital baseband samples. The wireless protocol stack 120 stores advance intelligence information associated with the RF signal. In an embodiment of the present invention, the advance intelligence information includes at least one of a number of resource blocks (RBs) per user equipment (UE), a total number of RBs, a type of channel, a set of open loop power control parameters, a signal-to-interference plus noise ratio (SINR) target and a modulation scheme of the RF signal. The type of channel may include at least one of physical uplink control channel (PUCCH), physical uplink shared channel (PUSCH), random access channel (RACE), sounding reference signal (SRS) and a NULL channel. The gain table 122 stores a mapping between a plurality of RSSI and dBFS values corresponding to a sub-frame and corresponding gain values required to amplify a portion of the RF signal corresponding to the sub-frame, to the pre-configured set-point of the ADC. The mode selection module 118 receives the advance intelligence information from the wireless protocol stack 120 and fetches gain values from the gain table 122. Exemplary entries of the gain table 122 are shown in Table A.

TABLE A

| AGC Index | RSSI value (dBm) | dBFS value | Gain value |
|---|---|---|---|
| 0 | −5 | −12 | 0 |
| 1 | −8 | −15 | 3 |
| 19 | −62 | −69 | 57 |
| 20 | −65 | −72 | 60 |
| 23 | −74 | −81 | 69 |

The mode selection module 118 receives the RSSI and dBFS values of the first sub-frame from the RSSI and dBFS registers 112 and 114, compares the RSSI value with a threshold RSSI value and the dBFS value with a threshold dBFS value and checks the presence of first user-data in the first sub-frame. The mode selection module 118 then sends an 'enable AGC mode' command to the gain control module 110 and configures the gain control module 110 to operate in the AGC mode if the first sub-frame includes the first user-data. If the first sub-frame does not include the first user-data, the mode selection module 118 retrieves advance intelligence information associated with the RF signal from the wireless protocol stack 120. Based on the advance intelligence information, the mode selection module 118 checks the presence of second user-data in the second sub-frame that is scheduled to be received subsequent to the first sub-frame. If the first and second sub-frames do not include the first and second user-data, then the mode selection module 118 sends the 'enable AGC mode' command to the gain control module 110 and configures the gain control module 110 to operate in the AGC mode. If the first sub-frame does not include the first user-data and the second sub-frame includes the second user-data, then the mode selection module 118 calculates an estimated signal power level for a portion of the RF signal corresponding to the second sub-frame. The estimated signal power level is a power level of the portion of the RF signal corresponding to the second sub-frame if the gain stage 108 uses the first gain value to amplify that portion. The mode selection module 118 fetches the first gain value from the gain table 122 based on the RSSI and dBFS values of the first sub-frame and calculates an estimated signal power level based on the advance intelligence information and the first gain value. The mode selection module 118 then compares the estimated signal power level with a threshold power level. In an example, the threshold power level may be equivalent to the pre-configured set-point of the ADC (e.g., −5 dBm) of the wireless communication system 100. The mode selection module 118 checks whether the estimated signal power level exceeds the threshold power level to determine whether the ADC will be saturated if the first gain value is used by the gain stage 108 to amplify the portion of the RF signal corresponding to the second sub-frame. If the estimated signal power level exceeds the threshold power level, the mode selection module 118 fetches the second gain value from the gain table 122. The mode selection module 118 then sends an 'enable MGC mode' command to the gain control module 110 and configures the gain control module 110 to operate in the MGC mode and stores the second gain value in the gain register 116 of the gain control module 110. If the estimated signal power level is less than the threshold power level, the mode selection module 118 sends the 'enable AGC mode' command to the gain control module 110 and configures the gain control module 110 to operate in the AGC mode.

Table B illustrates the application of the advanced intelligence information for configuring the operation mode of the gain control module 110.

TABLE B

| Number of RBs for 2nd sub-frame | Modulation scheme | SINR target | Signal power based on number of RBs and interference of −100 dBm/RB in channel (RSSI value) | First gain value (first sub-frame is silent sub-frame) | Estimated signal power level | Generated 2nd gain value | Need to change to MGC mode? |
|---|---|---|---|---|---|---|---|
| 96 RBs | 64 QAM | 18 dB | −62 dBm | 69 dB | 7 dBm | −5 dBm − (−62 dBm) = 57 dB | Yes |
| 2 RBs | QPSK | 7 dB | −90 dBm | 69 dB | −21 dBm | Not required to be computed | No |

For example, if the mode selection module 118 uses the advance intelligence information to determine that 96 RBs are allocated for the second sub-frame and identifies the second sub-frame as a user sub-frame with high user-data (high traffic data type), then based on the number of RBs, the SINR target and the modulation scheme of the RF signal, e.g., quadrature amplitude modulation (QAM) or quadrature phase shift keying (QPSK), the mode selection module 118 determines that the portion of the RF signal corresponding to the second sub-frame would be received at the wireless communication system 100 with a signal power level of −62 dBm. Based on the first gain value (considering that the first sub-frame is a silent sub-frame) fetched by the mode selection module 118 from the gain table 122, the mode selection module 118 calculates the estimated signal power level at 7 dBm. Since the estimated signal power level exceeds the pre-configured set-point of the ADC, the mode selection module 118 generates a second gain value of 57 dB and configures the gain control module 110 to operate in the MGC mode and thus prevents saturation of the ADC.

In another example, the mode selection module 118 uses the advance intelligence information to determine that 2 RBs are allocated for the second sub-frame and identifies the second sub-frame as a user sub-frame with low user-data (low traffic data type, which may be VoIP traffic). Based on the number of RBs, the SINR target and the modulation scheme of the RF signal, e.g., quadrature amplitude modulation (QAM) or quadrature phase shift keying (QPSK), the mode selection module 118 determines that the portion of the RF signal corresponding to the second sub-frame would be received at the wireless communication system 100 with a signal power level of −90 dBm. Based on the first gain value (considering that the first sub-frame is a silent sub-frame) fetched by the mode selection module 118 from the gain table 122, the mode selection module 118 calculates the estimated signal power level at −21 dBm. Since the estimated signal power level is less than the pre-configured set-point of the ADC and will not cause saturation in the ADC, the mode selection module 118 determines that the second gain value need not be generated and configures the gain control module 110 to operate in the AGC mode.

Figure 2:
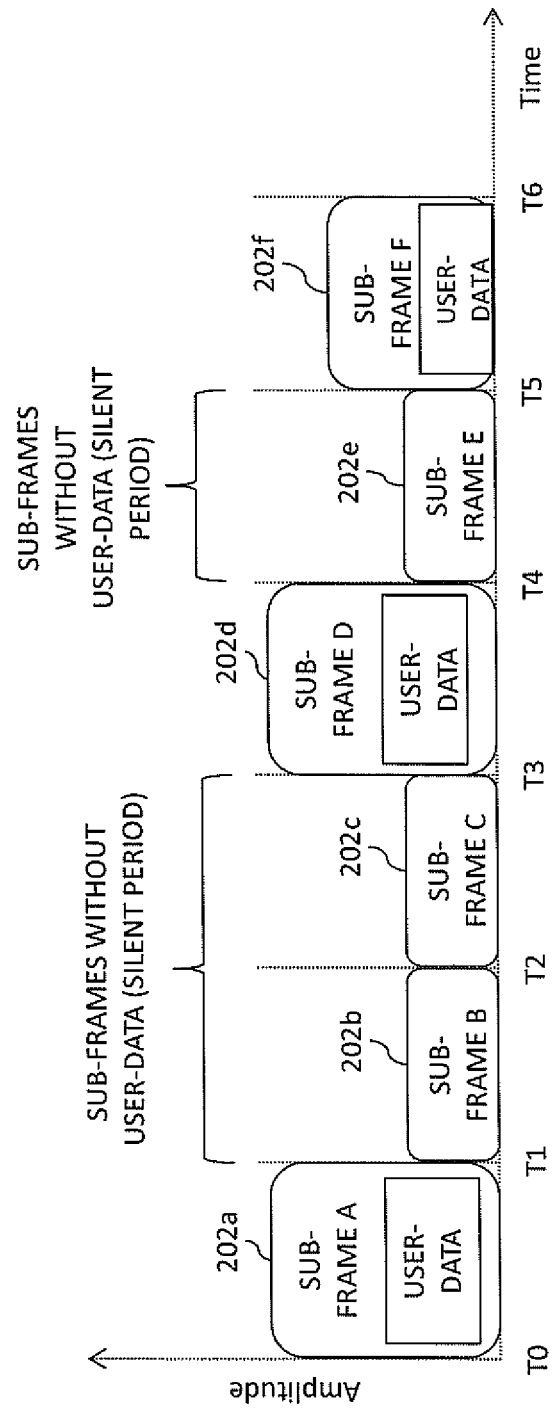
FIG. 2 is a timing diagram illustrating a plurality of sub-frames of a radio frequency (RF) signal in accordance with an embodiment of the present invention.

Referring now to FIG. 2, a timing diagram illustrating a plurality of sub-frames of the RF signal received by the wireless communication system 100 is shown. During T0-T1, the RF front-end 106 receives a sub-frame 202a. The gain control module 110 computes the RSSI and dBFS values of the sub-frame 202a and stores the RSSI and dBFS values of the sub-frame 202a in the RSSI and dBFS registers 112 and 114, respectively. The mode selection module 118 retrieves the RSSI and dBFS values of the sub-frame 202a from the RSSI and dBFS registers 112 and 114, respectively, and checks for the presence of the first user-data, i.e. a user-data of the sub-frame 202a. Since the sub-frame 202a carries the first user-data, the mode selection module 118 configures the gain control module 110 to operate in the AGC mode. The gain control module 110 stores the first gain value associated with the sub-frame 202a in the gain register 116. Thus, at time T1, when the wireless communication system 100 receives a sub-frame 202b, the gain stage 108 amplifies the portion of the RF signal corresponding to the sub-frame 202b based on the first gain value.

From time period T1-T2, the sub-frame 202b is received by the RF front-end 106. The gain control module 110 computes the RSSI and dBFS values of the sub-frame 202b and stores the RSSI and dBFS values associated with the sub-frame 202b in the RSSI and dBFS registers 112 and 114, respectively. The mode selection module 118 retrieves the RSSI and dBFS values of the sub-frame 202b from the RSSI and dBFS registers 112 and 114, respectively, and checks for the presence of the first user-data. The mode selection module 118 also retrieves the advance intelligence information from the wireless protocol stack 120 and determines that a sub-frame 202c is scheduled to be received subsequent to the sub-frame 202b. The mode selection module 118 then checks for the presence of the second user-data in the sub-frame 202c based on the advance intelligence information. Since the sub-frames 202b and 202c do not include the first and second user-data, the mode selection module 118 identifies the sub-frames 202b and 202c as first and second silent sub-frames 202b and 202c and configures the gain control module 110 to operate in the AGC mode. Thus, at time T2, when the wireless communication system 100 receives the second silent sub-frame 202c, the gain stage 108 amplifies the portion of the RF signal corresponding to the second silent sub-frame 202c based on the first gain value.

From time period T2-T3, the second silent sub-frame 202c is received by the RF front-end 106. The gain control module 110 computes the RSSI and dBFS values of the second silent sub-frame 202c and stores the RSSI and dBFS values associated with the second silent sub-frame 202c in the RSSI and dBFS registers 112 and 114, respectively. The mode selection module 118 retrieves the RSSI and dBFS values of the second silent sub-frame 202c from RSSI and dBFS registers 112 and 114, respectively, and checks for the presence of the first user-data. Since the second silent sub-frame 202c does not include the first user-data, the mode selection module 118 also retrieves the advance intelligence information from the wireless protocol stack 120 and determines that a sub-frame 202d is scheduled to be received subsequent to the second silent sub-frame 202c. The mode selection module 118 then checks for the presence of the second user-data in the sub-frame 202d based on the advance intelligence information retrieved from the wireless protocol stack 120. Since the sub-frame 202d includes the second user-data, i.e. a user-data of sub-frame 202d, the mode selection module 118 fetches the first gain value from the gain table 122 and calculates an estimated signal power level for a portion of the RF signal corresponding to the sub-frame 202d based on the advance intelligence information. Since the mode selection module 118 determines that the estimated signal power level for a portion of the RF signal corresponding to the sub-frame 202d exceeds the threshold power level, the mode selection module 118 fetches the second gain value from the gain table 122. The mode selection module 118 then configures the gain control module 110 to operate in the MGC mode and stores the second gain value in the gain register 116 of the gain control module 110. Thus, at time T3, when the wireless communication system 100 receives the sub-frame 202d, the gain stage 108 amplifies the portion of the RF signal corresponding to the sub-frame 202d based on the second gain value.

From time period T3-T4, the sub-frame 202d is received by the RF front-end 106. Since the sub-frame 202d includes user-data, the mode selection module 118 configures the gain control module 110 to operate in the AGC mode. Thus, at time T4, when the wireless communication system 100 receives a sub-frame 202e, the gain stage 108 amplifies the portion of the RF signal corresponding to the sub-frame 202e based on the first gain value.

From time period T4-T5, the sub-frame 202e is received by the RF front-end 106. The gain control module 110 computes the RSSI and dBFS values of the sub-frame 202e and stores the RSSI and dBFS values associated with the sub-frame 202e in the RSSI and dBFS registers 112 and 114, respectively. The mode selection module 118 retrieves the RSSI and dBFS values of the sub-frame 202e from RSSI and dBFS registers 112 and 114, respectively, and checks for the presence of the first user-data. Since the sub-frame 202e does not include the first user-data, the mode selection module 118 determines the sub-frame 202e as a third silent sub-frame 202e and retrieves the advance intelligence information from the wireless protocol stack 120 to determine that a sub-frame 202f is scheduled to be received subsequent to the third silent sub-frame 202e. The mode selection module 118 then checks for the presence of the second user-data in the sub-frame 202f based on the advance intelligence information retrieved from the wireless protocol stack 120. Since the sub-frame 202f includes the second user-data, i.e. a user-data of sub-frame 202f, the mode selection module 118 fetches the first gain value associated with the third silent sub-frame 202e from the gain table 122 and calculates an estimated signal power level for a portion of the RF signal corresponding to the sub-frame 202f based on the advance intelligence information. Since the mode selection module 118 determines that the estimated signal power level for the portion of the RF signal corresponding to the sub-frame 202f is less than the threshold power level, the mode selection module 118 configures the gain control module 110 to operate in the AGC mode. Thus, at time T5, when the wireless communication system 100 receives the sub-frame 202f, the gain stage 108 amplifies the portion of the RF signal corresponding to the sub-frame 202f based on the first gain value.

Figure 3A:
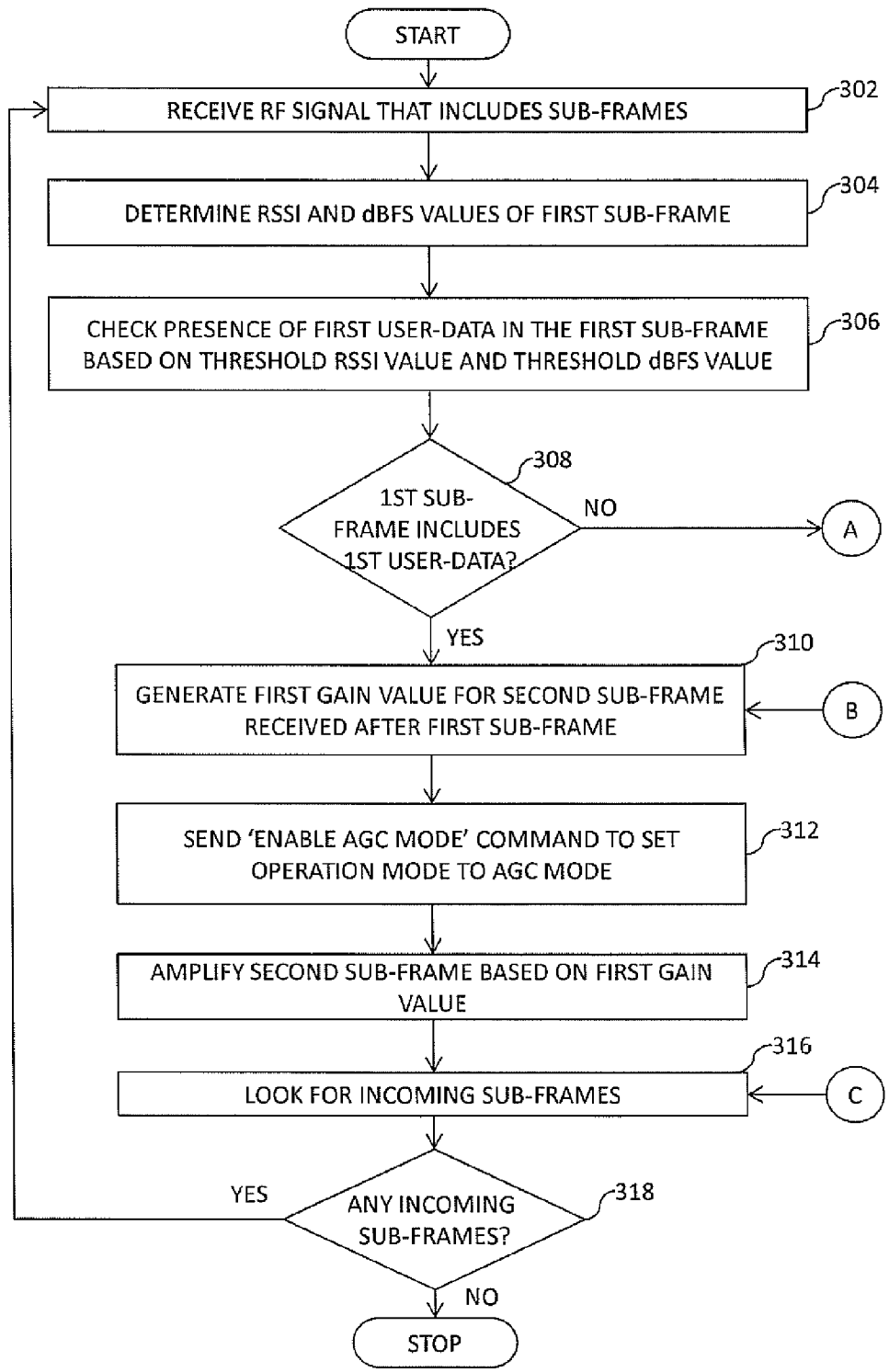
FIGS. 3A and 3B are a flow chart illustrating a method for controlling gain of a radio frequency (RF) signal in accordance with an embodiment of the present invention.
Figure 3B:
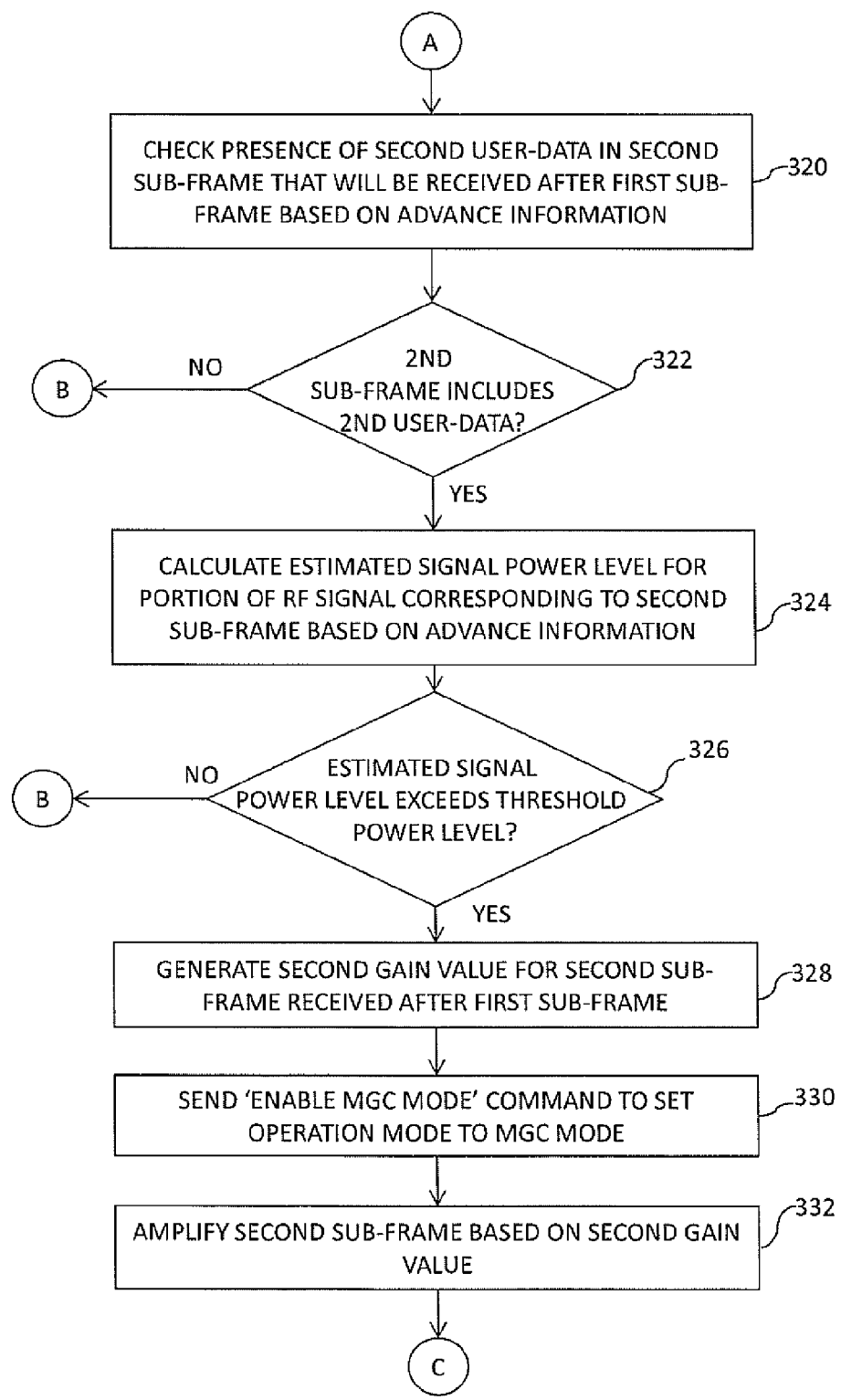

Referring now to FIGS. 3A and 3B, a flow chart illustrating a method for controlling gain of the RF signal in the wireless communication system 100 in accordance with an embodiment of the present invention is shown. At step 302, the RF front-end 106 receives the RF signal, which includes a plurality of sub-frames. At step 304, the gain control module 110 determines RSSI and dBFS values of the sub-frame 202a (hereinafter referred to as "the first sub-frame") of a plurality of sub-frames. At step 306, the mode selection module 118 checks the presence of user-data of the sub-frame 202a (hereinafter referred to as "the first user-data") in the first sub-frame by comparing the RSSI value with a threshold RSSI value and the dBFS value with a threshold dBFS value. At step 308, the mode selection module 118 checks whether the first sub-frame 202a includes the first user-data. If the mode selection module 118 determines that the first sub-frame 202a includes the first user-data at step 308, i.e. the first sub-frame 202a is a user sub-frame, step 310 is executed.

At step 310, the gain control module 110 generates a first gain value for the sub-frame 202b (hereinafter referred to as "second sub-frame") that is received subsequent to the first sub-frame 202a. At step 312, the mode selection module 118 sends the 'enable AGC mode' command to the gain control module 110 and configures the gain control module 110 to operate in the AGC mode. At step 314, the gain stage 108 amplifies the second sub-frame 202b based on the first gain value. At step 318, the RF front-end 106 looks for incoming sub-frames.

However, if at step 308, it is determined that the first sub-frame 202a does not include the first user-data, i.e. the first sub-frame 202a is a silent sub-frame, step 320 is executed. At step 320, the mode selection module 118 checks the presence of second user-data in the second sub-frame 202b which will be received subsequent to the first sub-frame 202a based on an advance intelligence information associated with the RF signal obtained from the wireless protocol stack 120. At step 322, the mode selection module 118 checks whether the second sub-frame 202b includes the second user-data. If the mode selection module 118 determines that the second sub-frame 202b includes the second user-data, i.e. the second sub-frame 202b is a user sub-frame, at step 322, then step 324 is executed. At step 324, the mode selection module 118 calculates an estimated signal power level for a portion of the RF signal corresponding to the second sub-frame 202b based on the advance intelligence information and a first gain value associated with the first sub-frame 202a. At step 326, the mode selection module 118 checks whether the estimated signal power level exceeds a threshold power level. If the mode selection module 118 determines that the estimated signal power level for a portion of the RF signal corresponding to the second sub-frame 202b exceeds the threshold power level, at step 326, then step 328 is executed.

At step 328, the mode selection module 118 generates a second gain value by fetching the second gain value from the gain table 122 for the second sub-frame 202b that is received subsequent to the first sub-frame 202a. At step 330, the mode selection module 118 sends the 'enable MGC mode' command to the gain control module 110 and configures the gain control module 110 to operate in the MGC mode and provides the second gain value to the gain control module 110. At step 332, the gain stage 108 amplifies the second sub-frame 202b based on the second gain value. However, if at step 322, it is determined that the second sub-frame 202b does not include the second user-data, i.e. the second sub-frame 202b is a silent sub-frame, then step 310 is executed. Further, if at step 326, it is determined that the estimated signal power level for a portion of the RF signal corresponding to the second sub-frame 202b is less than a threshold power level, then step 310 is executed.

In an embodiment of the present invention, the wireless communication system operates in at least one of a long term evolution (LTE) standard, a third generation partnership project (3GPP) standard, and a high speed packet access (HSPA) standard. In another embodiment of the present invention, the wireless communication system is integrated in at least one of a base station and a user equipment (UE).

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A system for providing gain control to a gain stage of a wireless communication system that receives a radio frequency (RF) signal, wherein the RF signal includes a plurality of sub-frames, the system comprising:

a gain control module that determines a received signal strength indication (RSSI) value and a decibel amplitude level relative to full scale (dBFS) value of a first sub-frame of the plurality of sub-frames, and stores a first gain value for a second sub-frame of the plurality of sub-frames when configured to operate in an automatic gain control (AGC) mode and a second gain value for the second sub-frame when configured to operate in a manual gain control (MGC) mode, wherein the second sub-frame is received subsequent to the first sub-frame; and a mode selection module, connected to the gain control module, that:
receives the RSSI and dBFS values,
checks for the presence of first user-data in the first sub-frame based on at least one of the RSSI and dBFS values,
configures the gain control module to operate in the AGC mode when the first sub-frame includes the first user-data,
checks for the presence of second user-data in the second sub-frame based on an advance intelligence information associated with the RF signal when the first sub-frame does not include the first user-data,
configures the gain control module to operate in the AGC mode when the second sub-frame does not include the second user-data,
calculates an estimated signal power level for a portion of the RF signal corresponding to the second sub-frame based on the advance intelligence information and the first gain value when the second sub-frame includes the second user-data, and
configures the gain control module to operate in the AGC mode when the estimated signal power level is less than a threshold power level and the MGC mode when the estimated signal power level exceeds the threshold power level,
wherein the gain stage amplifies the portion of the RF signal corresponding to the second sub-frame based on the first gain value when the gain control module operates in the AGC mode and the second gain value when the gain control module operates in the MGC mode.

2. The gain control system of claim 1, further comprising a gain table, connected to the mode selection module, that stores a mapping between a plurality of RSSI and dBFS values corresponding to a sub-frame of the plurality of sub-frames and corresponding gain values.

3. The gain control system of claim 2, wherein:
the mode selection module fetches the first gain value from the gain table to calculate the estimated signal power level, and
fetches the second gain value from the gain table and provides the second gain value to the gain control module when the gain control module is configured to operate in the MGC mode.

4. The gain control system of claim 1, wherein the gain control module generates the first gain value when it is in the AGC mode, and wherein the first gain value comprises a gain associated with the first sub-frame.

5. The gain control system of claim 1, wherein the mode selection module compares the RSSI value with a threshold RSSI value, and compares the dBFS value with a threshold dBFS value to check for the presence of the first user-data in the first sub-frame.

6. The gain control system of claim 1, wherein the advance intelligence information includes at least one of a number of resource blocks per user equipment (UE), a total number of resource blocks, a type of channel, a set of open loop power control parameters, a signal-to-interference plus noise ratio (SINR) target, and a modulation scheme of the RF signal.

7. The gain control system of claim 1, wherein at least one of the gain control module and the mode selection module is implemented in a baseband processor of the wireless communication system.

8. The gain control system of claim 1, wherein the system is integrated in at least one of a base station and a user equipment (UE).

9. A wireless communication system, comprising:
a radio frequency (RF) front-end that receives a RF signal, wherein the RF signal includes a plurality of sub-frames;
a gain controller that determines a received signal strength indication (RSSI) value and a decibel amplitude level relative to full scale (dBFS) value of a first sub-frame of the plurality of sub-frames, and stores a first gain value for a second sub-frame of the plurality of sub-frames when configured to operate in an automatic gain control (AGC) mode and a second gain value for the second sub-frame when configured to operate in a manual gain control (MGC) mode, wherein the second sub-frame is received subsequent to the first sub-frame;
a gain stage, connected to the gain controller and the RF front-end, that amplifies a portion of the RF signal corresponding to the second sub-frame based on the first gain value when the gain controller is in the AGC mode and the second gain value when the gain controller is in the MGC mode; and
a processor, connected to the gain controller, that receives the RSSI and dBFS values, checks for the presence of first user-data in the first sub-frame based on at least one of the RSSI and dBFS values, configures the gain controller to operate in the AGC mode when the first sub-frame includes the first user-data, checks for the presence of second user-data in the second sub-frame based on an advance intelligence information associated with the RF signal when the first sub-frame does not include the first user-data, configures the gain controller to operate in the AGC mode when the second sub-frame does not include the second user-data, calculates an estimated signal power level for a portion of the RF signal corresponding to the second sub-frame based on the advance intelligence information and the first gain value when the second sub-frame includes the second user-data, and configures the gain controller to operate in the AGC mode when the estimated signal power level is less than a threshold power level and the MGC mode when the estimated signal power level exceeds the threshold power level.

10. The wireless communication system of claim 9, wherein the processor further comprises a gain table that stores a mapping between a plurality of RSSI and dBFS values corresponding to a sub-frame of the plurality of sub-frames and corresponding gain values.

11. The wireless communication system of claim 10, wherein the processor fetches the first gain value from the gain table to calculate the estimated signal power level, and fetches the second gain value from the gain table and provides the second gain value to the gain controller when the gain controller is in the MGC mode.

12. The wireless communication system of claim 9, wherein the gain controller generates the first gain value when the gain controller is in the AGC mode, wherein the first gain value comprises a gain associated with the first sub-frame.

13. The wireless communication system of claim 9, wherein the processor compares the RSSI value with a threshold RSSI value and the dBFS value with a threshold dBFS value to check for the presence of the first user-data in the first sub-frame.

14. The wireless communication system of claim 9, wherein the advance intelligence information includes at least one of a number of resource blocks per user equipment (UE), a total number of resource blocks, a type of channel, a set of open loop power control parameters, a signal-to-interference plus noise ratio (SINR) target, and a modulation scheme of the RF signal.

15. A method for controlling gain of a radio frequency (RF) signal, wherein the RF signal includes a plurality of sub-frames, the method comprising:
determining a received signal strength indication (RSSI) value and a decibel amplitude level relative to full scale (dBFS) value of a first sub-frame of the plurality of sub-frames;
checking for the presence of first user-data in the first sub-frame based on at least one of the RSSI and dBFS values;
generating a first gain value for a second sub-frame of the plurality of sub-frames;
amplifying a portion of the RF signal that corresponds to the second sub-frame based on the first gain value when the first sub-frame includes the first user-data, wherein the second sub-frame is received after the first sub-frame;
checking for the presence of second user-data in the second sub-frame based on an advance information associated with the RF signal when the first sub-frame does not include the first user-data;
amplifying a portion of the RF signal that corresponds to the second sub-frame based on the first gain value when the first and second sub-frames do not include the first and second user-data, respectively;
calculating an estimated signal power level for the portion of the RF signal corresponding to the second sub-frame based on the advance information and the first gain value when the first sub-frame does not include the first user-data and the second sub-frame includes the second user-data;

amplifying the portion of the RF signal that corresponds to the second sub-frame based on the first gain value when the estimated signal power level is less than a threshold power level;

generating a second gain value for the second sub-frame when the estimated signal power level exceeds the threshold power level; and amplifying the portion of the RF signal that corresponds to the second sub-frame based on the second gain value when the estimated signal power level exceeds the threshold power level.

16. The method of claim 15, wherein the step of generating the second gain value for the second sub-frame comprises fetching the second gain value from a gain table that stores a mapping between a plurality of RSSI and dBFS values corresponding to a sub-frame of the plurality of sub-frames and corresponding gain values.

17. The method of claim 15, wherein the first gain value comprises a gain associated with the first sub-frame.

18. The method of claim 15, wherein the step of checking for the presence of the first user-data in the first sub-frame comprises comparing the RSSI value with a threshold RSSI value and the dBFS value with a threshold dBFS value.

19. The method of claim 15, wherein the advance information includes at least one of a number of resource blocks per user equipment (UE), a total number of resource blocks, a type of channel, a set of open loop power control parameters, a signal-to-interference plus noise ratio (SINR) target, and a modulation scheme of the RF signal.

\* \* \* \* \*